(12) United States Patent
Park et al.

(10) Patent No.: US 8,946,343 B2
(45) Date of Patent: Feb. 3, 2015

(54) ADHESIVE COMPOSITION FOR SEMICONDUCTORS, ADHESIVE FILM PREPARED USING THE SAME, AND SEMICONDUCTOR DEVICE INCLUDING THE FILM

(75) Inventors: Baek Soung Park, Uiwang-si (KR); Ki Tae Song, Uiwang-si (KR); In Hwan Kim, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 169 days.

(21) Appl. No.: 13/571,574

(22) Filed: Aug. 10, 2012

(65) Prior Publication Data

US 2013/0041088 A1    Feb. 14, 2013

(30) Foreign Application Priority Data

Aug. 11, 2011   (KR) .................. 10-2011-0080169

(51) Int. Cl.
*C09J 163/00*      (2006.01)

(52) U.S. Cl.
USPC .............................. 524/502; 525/109; 521/135

(58) Field of Classification Search
USPC .............................. 524/502; 525/109; 521/135
See application file for complete search history.

(56) References Cited

FOREIGN PATENT DOCUMENTS

WO   WO 2006/107792 A1 * 10/2006 ............. C08K 13/00

* cited by examiner

*Primary Examiner* — Robert D. Harlan
(74) *Attorney, Agent, or Firm* — Lee & Morse, P.C.

(57) ABSTRACT

An adhesive composition for semiconductors, an adhesive film prepared using the adhesive composition, and a semiconductor device including the adhesive film, the adhesive composition exhibiting two exothermic peaks at temperatures ranging from 65° C. to 350° C., wherein a first exothermic peak appears at a lower temperature than a second exothermic peak, and the adhesive composition has a curing rate of about 70% to 100% in a first exothermic peak zone, as calculated by Equation 1:

Curing rate=[(Heating value upon 0 cycle−Heating value after 1 cycle)/Heating value upon 0 cycle]× 100.

21 Claims, No Drawings

ADHESIVE COMPOSITION FOR SEMICONDUCTORS, ADHESIVE FILM PREPARED USING THE SAME, AND SEMICONDUCTOR DEVICE INCLUDING THE FILM

CROSS-REFERENCE TO RELATED APPLICATION

Korean Patent Application No. 10-2011-0080169, filed on Aug. 11, 2011, in the Korean Intellectual Property Office, and entitled: "ADHESIVE COMPOSITION FOR SEMICONDUCTOR AND ADHESIVE FILM COMPRISING THE SAME," is incorporated by reference herein in its entirety.

BACKGROUND

1. Field

Embodiments relate to an adhesive composition for semiconductors, an adhesive film prepared using the same, and a semiconductor device including the film.

2. Description of the Related Art

High capacity of a semiconductor device may be achieved by circuit integration (in terms of quality), in which a number of cells per unit area is increased, or by packaging (in terms of quantity), in which chips are stacked one above another.

Among packaging techniques, multi-chip packaging (hereinafter, "MCP") in which several chips are stacked one above another via adhesives and are electrically connected to each other via wire bonding has been considered.

SUMMARY

Embodiments are directed to an adhesive composition for semiconductors, an adhesive film prepared using the same, and a semiconductor device including the film.

The embodiments may be realized by providing an adhesive composition for semiconductors, the adhesive composition exhibiting two exothermic peaks at temperatures ranging from 65° C. to 350° C., wherein a first exothermic peak appears at a lower temperature than a second exothermic peak, and the adhesive composition has a curing rate of about 70% to 100% in a first exothermic peak zone, as calculated by Equation 1:

Curing rate=[(Heating value upon 0 cycle−Heating value after 1 cycle)/Heating value upon 0 cycle]× 100.

The adhesive composition may have a curing rate of 0 to about 20% in a second exothermic peak zone, as calculated by Equation 1.

The first exothermic peak may appear at a temperature of about 65° C. to about 185° C. and the second exothermic peak may appear at a temperature of about 155° C. to about 350° C.

The adhesive composition may include a thermoplastic resin, an epoxy resin, curing agents, the curing agents including two kinds of curing agents activated in different reaction temperature zones, and a curing catalyst, the curing catalyst selectively promoting a curing reaction of the curing agent activated in a lower reaction temperature zone.

The curing agents may include a phenolic curing agent and an amine curing agent, and the curing catalyst may include a phosphorus-containing catalyst.

The phenolic curing agent may be represented by Formula 1:

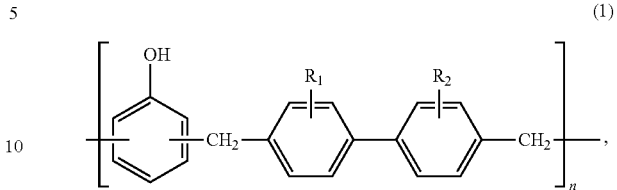

and in Formula 1, $R_1$ and $R_2$ may each independently be a $C_1$-$C_6$ alkyl group and n may be about 2 to about 100.

The amine curing agent may be represented by Formula 2:

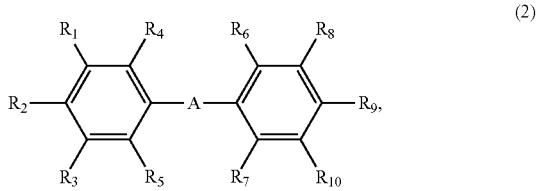

and in Formula 2, A may be a single bond or may be selected from the group of —$CH_2$—, —$CH_2CH_2$—, —$SO_2$—, —NHCO—, —$C(CH_3)_2$—, and —O—, and $R_1$ to $R_{10}$ may each independently be selected from hydrogen, $C_1$-$C_4$ alkyl groups, $C_1$-$C_4$ alkoxy groups, and amine groups, provided that at least two of $R_1$ to $R_{10}$ are amine groups.

The phenolic curing agent and the amine curing agent may be present in the composition in a weight ratio of about 3:1 to about 1:11.

The adhesive composition may further include fillers and a silane coupling agent.

The embodiments may also be realized by providing an adhesive composition for semiconductors, the adhesive composition exhibiting two exothermic peaks at temperatures ranging from 65° C. to 350° C., wherein a first exothermic peak appears at a lower temperature than a second exothermic peak, and the adhesive composition has a void proportion of 15% or less after 1 cycle.

The first exothermic peak may appear at a temperature ranging from about 65° C. to about 185° C., and the second exothermic peak may appear at a temperature ranging from about 155° C. to about 350° C.

The adhesive composition may include about 16 to about 65 wt % of a thermoplastic resin, about 10 to about 25 wt % of an epoxy resin, about 0.5 to about 14 wt % of a phenolic curing agent, about 1 to about 10 wt % of an amine curing agent, about 0.1 to about 10 wt % of a phosphorus-containing catalyst, about 0.14 to about 5 wt % of a silane coupling agent, and about 10 to about 60 wt % of fillers, all wt % being based on a total solid content of the composition.

The embodiments may also be realized by providing an adhesive composition for semiconductors, the adhesive composition exhibiting two exothermic peaks at temperatures ranging from 65° C. to 350° C., wherein a first exothermic peak appears at a lower temperature than a second exothermic peak, and the adhesive composition has a peak height reduction rate of about 70% to 100% in a first exothermic peak zone, as calculated by Equation 2:

Peak height reduction rate=[(Peak height upon 0 cycle−Peak height after 1 cycle)/Peak height upon 0 cycle]×100.

The adhesive composition may have a peak height reduction rate of 0% to about 20% in a second exothermic peak zone, as calculated by Equation 2.

The first exothermic peak zone may have a peak height of about 0.01 W/g to about 0.5 W/g.

A second exothermic peak zone may have a peak height of about 0.5 W/g to about 1.0 W/g.

The first exothermic peak may appear at a temperature ranging from about 65° C. to about 185° C., and the second exothermic peak may appear at a temperature ranging from about 155° C. to about 350° C.

The adhesive composition may include about 16 to about 65 wt % of a thermoplastic resin, about 10 to about 25 wt % of an epoxy resin, about 0.5 to about 14 wt % of a phenolic curing agent, about 1 to about 10 wt % of an amine curing agent, about 0.1 to about 10 wt % of a phosphorus-containing catalyst, about 0.14 to about 5 wt % of a silane coupling agent, and about 10 to about 60 wt % of fillers, all wt % being based on a total solid content of the composition.

The embodiments may also be realized by providing an adhesive film for semiconductors, the adhesive film being prepared using the adhesive composition according to an embodiment.

The embodiments may also be realized by providing a semiconductor device comprising the adhesive film according to an embodiment.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present.

Unless otherwise defined, contents of each component will be recited in terms of solid content.

The embodiments provide an adhesive composition for semiconductors. The adhesive composition may have two exothermic peaks in an exothermic zone of about 65° C. to about 350° C. The exothermic zone is defined as a temperature zone where an amount of heat generated is 10 J/g or greater, as determined by differential scanning calorimetry (DSC) at a temperature elevation rate of 10° C./min. The exothermic peaks are defined as points where the amount of heat generated is highest in the exothermic zone. The first exothermic peak may appear at a lower temperature than the second exothermic peak. The adhesive composition may have a curing rate of about 70% to 100% in the first exothermic peak zone, as calculated by Equation 1, below.

Curing rate=[(Heating value upon 0 cycle−Heating value after 1 cycle)/Heating value upon 0 cycle]× 100.

In Equation 1, the heating value upon 0 cycle refers to the amount of heat as measured before the adhesive composition is cured, and the heating value after 1 cycle refers to the amount of heat as measured after curing the adhesive composition in an oven at 150° C. for 10 minutes and curing on a hot plate at 150° C. for 30 minutes.

According to an embodiment, the adhesive composition may have a curing rate of about 70% to 100% in the first exothermic peak zone and a curing rate of 0% to about 20% in the second exothermic peak zone. For example, the adhesive composition may be completely cured in the first exothermic peak zone and may not be substantially cured in the second exothermic peak zone, thereby providing a low temperature curing zone and a high temperature curing zone independent of each other.

Thus, for the adhesive composition, the low temperature curing zone and the high temperature curing zone may be independent of each other, thereby facilitating a time reduction or complete elimination of a semi-curing and a post molding cure PMC process (which would otherwise be carried out after bonding the same kind of chip). Typically, if semi-curing were to be reduced or eliminated, voids may generally be formed due to high flowability of the composition during wire bonding. However, according to an embodiment, the adhesive composition may have discrete curing zones, e.g., the low temperature curing zone and the high temperature curing zone, thereby significantly reducing the void proportion.

For example, according to an embodiment, two types of curing agents activated in different reaction temperature zones may be used together with a curing catalyst. The curing catalyst may react with a curing agent activated in a low reaction temperature zone but may not react with a curing agent activated in a high reaction temperature zone, so as to provide a low temperature curing zone and a high temperature curing zone independent of each other. Thus, the low temperature curing zone may serve to secure initial reliability through suppression of void generation upon wire bonding by ensuring modulus as much as possible during wire bonding after die attachment. The high temperature curing zone may facilitate efficient removal of voids in EMC molding by imparting a residual curing rate after various curing processes following die attachment.

In an implementation, the first exothermic peak may appear in a temperature range of about 65° C. to about 185° C., and the second exothermic peak may appear in a temperature range of about 155° C. to about 350° C. In an implementation, the first exothermic peak may appear in a temperature range of about 65° C. to about 175° C., and the second exothermic peak may appear in a temperature range of about 155° C. to about 350° C. In an implementation, the first exothermic peak may appear in a temperature range of about 70° C. to about 165° C., and the second exothermic peak may appear in a temperature range of about 165° C. to about 350° C. In an implementation, the first exothermic peak may appear in a temperature range of about 90° C. to about 185° C. and the second exothermic peak may appear in a temperature range of about 185° C. to about 350° C.

The adhesive composition for semiconductors according to an embodiment may include, e.g., a thermoplastic resin, an epoxy resin, curing agents, and a curing catalyst. The curing agents may include two kinds of curing agents activated in different reaction temperature zones. The curing catalyst may selectively promote the curing reaction of the curing agent activated in a lower reaction temperature zone. In an implementation, the curing agents may include a phenolic curing agent and an amine curing agent, and the curing catalyst may include a phosphorus-containing catalyst.

The phenolic curing agent may include biphenyl groups in a main chain thereof. For example, the phenolic curing agent may be represented by Formula 1, below.

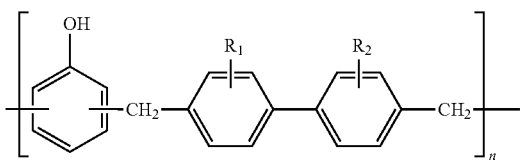

(1)

In Formula 1, $R_1$ and $R_2$ may each independently be a $C_1$-$C_6$ alkyl group and n may be about 2 to about 100.

The amine curing agent may be represented by Formula 2, below.

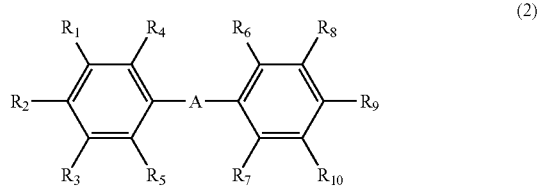

(2)

In Formula 2, A may be a single bond or may be selected from the group of —$CH_2$—, —$CH_2CH_2$—, —$SO_2$—, —NHCO—, —$C(CH_3)_2$—, and —O—, $R_1$ to $R_{10}$ may each independently be selected from hydrogen, $C_1$-$C_4$ alkyl groups, $C_1$-$C_4$ alkoxy groups, and amine groups. In an implementation, at least two of $R_1$ to $R_{10}$ may be amine groups.

The phenolic curing agent and the amine curing agent may be present in the composition in a weight ratio of about 3:1 to about 1:11.

According to an embodiment, an adhesive composition for semiconductors may have two exothermic peaks in an exothermic zone of 65° C. to 350° C. (when the exothermic zone is defined as a temperature zone where the amount of heat generated is 10 J/g or greater, as determined by differential scanning calorimetry (DSC) at a temperature elevation rate of 10° C./min, and the exothermic peaks are defined as points where the amount of heat generated is highest in the exothermic zone). The first exothermic peak may appear at a lower temperature than the second exothermic peak, and a proportion of voids after one cycle may be about 15% or less, e.g., about 10% or less.

Herein, the term "1 (one) cycle" refers to a curing process consisting of curing the adhesive composition in an oven at 150° C. for 10 minutes and curing on a hot plate at 150° C. for 30 minutes, which simulates a semi-curing process and a wire bonding process.

The adhesive composition according to the present embodiment may have a void proportion of less than about 10%, e.g., less than about 7%, after 1 cycle and molding, e.g., after curing at 150° C. for 10 minutes, curing at 150° C. for 30 minutes, and molding at 175° C. for 60 seconds, in this sequence.

In an implementation, the first exothermic peak may appear in a temperature range of about 65° C. to about 185° C., and the second exothermic peak may appear in a temperature range of about 155° C. to about 350° C. In an implementation, the first exothermic peak may appear in a temperature range of about 65° C. to about 175° C., and the second exothermic peak may appear in a temperature range of about 155° C. to about 350° C. In an implementation, the first exothermic peak may appear in a temperature range of about 70° C. to about 165° C., and the second exothermic peak may appear in a temperature range of about 165° C. to about 350° C. In an implementation, the first exothermic peak may appear in a temperature range of about 90° C. to about 185° C., and the second exothermic peak may appear in a temperature range of about 185° C. to about 350° C.

According to the present embodiment, the adhesive composition for semiconductors may include, e.g., a thermoplastic resin, an epoxy resin, curing agents, and a curing catalyst. The curing agents may include two kinds of curing agents activated in different reaction temperature zones. The curing catalyst may selectively promote the curing reaction of the curing agent activated in a lower reaction temperature zone. In an implementation, the curing agents may include a phenolic curing agent and an amine curing agent, and the curing catalyst may include a phosphorus-containing catalyst.

The phenolic curing agent may include biphenyl groups in a main chain thereof. In an implementation, the phenolic curing agent may be represented by Formula 1, below.

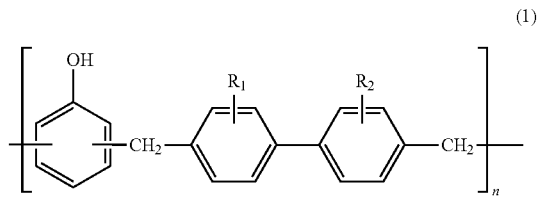

(1)

In Formula 1, $R_1$ and $R_2$ may each independently be a $C_1$-$C_6$ alkyl group and n may be about 2 to about 100.

The amine curing agent may be represented by Formula 2, below.

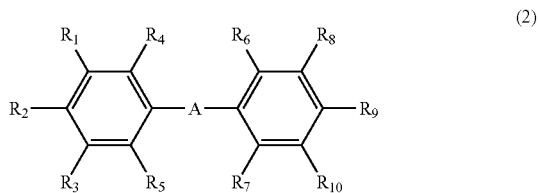

(2)

In Formula 2, A may be a single bond or may be selected from the group of —$CH_2$—, —$CH_2CH_2$—, —$SO_2$—, —NHCO—, —$C(CH_3)_2$—, and —O—, and $R_1$ to $R_{10}$ may each independently be selected from hydrogen, $C_1$-$C_4$ alkyl groups, $C_1$-$C_4$ alkoxy groups, and amine groups. In an implementation, at least two of $R_1$ to $R_{10}$ may be amine groups.

In an implementation, the phenolic curing agent and the amine curing agent may be present in the composition in a weight ratio of about 3:1 to about 1:11.

According to an embodiment, an adhesive composition for semiconductors may have two exothermic peaks in an exothermic zone of 65° C. to 350° C. (when the exothermic zone is defined as a temperature zone where the amount of heat generated is 10 J/g or greater, as determined by differential scanning calorimetry (DSC) at a temperature elevation rate of 10° C./min, and the exothermic peaks are defined as points where the amount of heat generated is highest in the exothermic zone). The first exothermic peak may appear at a lower temperature than the second exothermic peak. The adhesive composition may have a peak height reduction rate of about 70% to 100% in the first exothermic peak zone, as calculated by Equation 2, below Peak height reduction rate=[(Peak height upon 0 cycle−Peak height after 1 cycle)/Peak height upon 0 cycle]×100.

In Equation 2, the peak height upon 0 cycle refers to a peak height in a DSC-based exothermic peak before the adhesive composition is cured, i.e., when a curing heating value is determined by DSC before the prepared adhesive composition is cured. The peak height after 1 cycle refers to a peak height in the DSC-based exothermic peak as measured after curing in an oven at 150° C. for 10 minutes and curing on a hot plate at 150° C. for 30 minutes. Herein, the peak height refers to a height from a starting point of the first exothermic peak zone to a peak point thereof.

According to the present embodiment, the adhesive composition may have a peak height reduction rate of the first exothermic peak zone of about 70% to 100% after 1 cycle, and additionally, a peak height reduction rate of a second exothermic peak of 0% to about 20%, thereby providing a low temperature curing zone and a high temperature curing zone separated from each other.

Thus, in the adhesive composition according to an embodiment, the low temperature curing zone and the high temperature curing zone may be separated from each other, thereby facilitating a time reduction of or elimination of semi-curing and PMC process, which would otherwise be carried out after bonding the same kind of semiconductor chip.

In an implementation, the first exothermic peak may have a peak height of about 0.01 to about 0.5 W/g, and the second exothermic peak may have a peak height of about 0.5 to about 1.0 W/g, thereby facilitating removal of remaining voids. Herein, the peak height of the first exothermic peak zone refers to a height from a starting point of the first exothermic peak zone to a peak point of the first exothermic peak zone, and the peak height of the second exothermic peak zone refers to a height from a starting point of the first exothermic peak zone to a peak point of the second exothermic peak zone, as measured in W/g. The measurement of the peak height may be performed by scanning 5 mg of a sample at a temperature elevation rate of 10° C./min from 0 to 350° C.

Typically, if the semi-curing process were to be performed for a reduced time or completely eliminated, voids could be formed in the adhesive composition due to high flowability during a wire bonding process. According to an embodiment, the adhesive composition may have discrete curing zones, e.g., the low temperature curing zone and the high temperature curing zone, thereby significantly reducing a void generation rate.

In an implementation, the first exothermic peak may appear in a temperature range of about 65° C. to about 185° C., and the second exothermic peak may appear in a temperature range of about 155° C. to about 350° C. In an implementation, the first exothermic peak may appear in a temperature range of about 65° C. to about 175° C., and the second exothermic peak may appear in a temperature range of about 155° C. to about 350° C. In an implementation, the first exothermic peak may appear in a temperature range of about 70° C. to about 165° C., and the second exothermic peak may appear in a temperature range of about 165° C. to about 350° C. In an implementation, the first exothermic peak may appear in a temperature range of about 90° C. to about 185° C. and the second exothermic peak may appear in a temperature range of about 185° C. to about 350° C.

The adhesive composition according to the present embodiment may include, e.g., a thermoplastic resin, an epoxy resin, curing agents, and a curing catalyst. The curing agents may include two kinds of curing agents activated in different reaction temperature zones. The curing catalyst may selectively promote the curing reaction of the curing agent activated in a lower reaction temperature zone. In an implementation, the curing agents may include a phenolic curing agent and an amine curing agent, and the curing catalyst may include a phosphorus-containing catalyst.

The phenolic curing agent may include biphenyl groups in a main chain thereof. In an implementation, the phenolic curing agent may be represented by Formula 1, below.

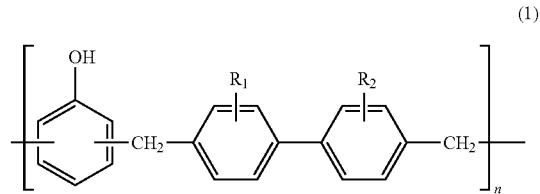

(1)

In Formula 1, $R_1$ and $R_2$ may each independently be a $C_1$-$C_6$ alkyl group and n may be about 2 to about 100.

The amine curing agent may be represented by Formula 2, below.

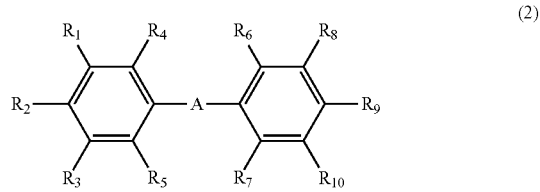

(2)

In Formula 2, A may be a single bond or may be selected from the group of —$CH_2$—, —$CH_2CH_2$—, —$SO_2$—, —NHCO—, —$C(CH_3)_2$—, and —O—, and $R_1$ to $R_{10}$ may each independently be selected from hydrogen, $C_1$-$C_4$ alkyl groups, $C_1$-$C_4$ alkoxy groups, and amine groups. In an implementation, at least two of $R_1$ to $R_{10}$ may be amine groups.

In an implementation, the phenolic curing agent and the amine curing agent may be present in the composition in a weight ratio of about 3:1 to about 1:11.

As described above, the adhesive composition for semiconductors according to an embodiment may include, e.g., the thermoplastic resin, the epoxy resin, curing agents, and the curing catalyst.

Thermoplastic Resin

Examples of suitable thermoplastic resins may include polyimide resins, polystyrene resins, polyethylene resins, polyester resins, polyamide resins, butadiene rubbers, acrylic rubbers, (meth)acrylate resins, urethane resins, polyphenylene ether resins, polyether imide resins, phenoxy resins, polycarbonate resins, polyphenylene ether resins, and modified polyphenylene ether resins. The thermoplastic resins may be used alone or as a mixture thereof. In an implementation, the thermoplastic resin may include epoxy groups. In an implementation, the thermoplastic resin may include a (meth)acrylic copolymer containing epoxy groups.

The thermoplastic resin may have a glass transition temperature of about −30 to about 80° C., e.g., about 5 to about 60° C. or about 5 to about 35° C. Within this range, high flowability (implying a good ability to remove voids) may be ensured, and high adhesive strength and reliability may be obtained.

In an implementation, the thermoplastic resin may have a weight average molecular weight of about 50,000 to about 5,000,000 g/mol.

The thermoplastic resin may be present in the composition in an amount of about 16 to about 65% by weight, e.g., about 20 to about 50% by weight or about 25 to about 45% by weight, based on a total solids content of the composition.

A weight ratio of the thermoplastic resin (A) to a mixture of the epoxy resin (B), the phenolic curing agent (C), and the amine curing agent (D) (i.e. (A):(B)+(C)+(D)) as a curing system may be about 25-65:35-75. Within this range, a number of voids after one cycle and a number of voids after molding may be considerably reduced. In an implementation, the weight ratio (A):(B)+(C)+(D) may be about 30-60:40-70.

Epoxy Resin

The epoxy resin may be curable and may impart adhesiveness to the composition. The epoxy resin may include, e.g., a liquid epoxy resin, a solid epoxy resin, or a mixture thereof.

Examples of suitable liquid epoxy resins may include bisphenol A type liquid epoxy resins, bisphenol F type liquid epoxy resins, tri- or higher polyfunctional liquid epoxy resins, rubber-modified liquid epoxy resins, urethane-modified liquid epoxy resins, acrylic modified liquid epoxy resins, and photosensitive liquid epoxy resins. The liquid epoxy resins may be used alone or as a mixture thereof. In an implementation, the liquid epoxy resin may include a bisphenol A type liquid epoxy resin.

The liquid epoxy resin may have an epoxy equivalent weight of about 100 to about 1,500 g/eq. In an implementation, the epoxy equivalent weight of the liquid epoxy resin may be about 150 to about 800 g/eq., e.g., about 150 to about 400 g/eq. Within this range, a cured product with good adhesiveness and heat resistance may be obtained, while still maintaining a desirable glass transition temperature.

The liquid epoxy resin may have a weight average molecular weight of about 100 to about 1,000 g/mol. Maintaining the weight average molecular weight within this range may help provide high flowability.

The solid epoxy resin may be a solid or quasi-solid at room temperature and may have one or more functional groups. The solid epoxy resin may have a softening point (Sp) of about 30 to about 100° C. Examples of suitable solid epoxy resins may include bisphenol type epoxy resins, phenol novolac type epoxy resins, o-cresol novolac type epoxy resins, polyfunctional epoxy resins, amine epoxy resins, heterocyclic epoxy resins, substituted epoxy resins, naphthol-based epoxy resins, biphenyl-based epoxy resins, and derivatives thereof.

Commercially available solid epoxy resins may include the following. Examples of bisphenol epoxy resins may include YD-017H, YD-020, YD020-L, YD-014, YD-014ER, YD-013K, YD-019K, YD-019, YD-017R, YD-017, YD-012, YD-011H, YD-011S, YD-011, YDF-2004, YDF-2001, (Kukdo Chemical Co., Ltd.), and the like. Examples of phenol novolac epoxy resins may include EPIKOTE 152 and EPIKOTE 154 (Yuka Shell Epoxy Co., Ltd.); EPPN-201 (Nippon Kayaku Co., Ltd.); DN-483 (Dow Chemical Company); YDPN-641, YDPN-638A80, YDPN-638, YDPN-637, YDPN-644, YDPN-631 (Kukdo Chemical Co., Ltd.), and the like. Examples of o-cresol novolac epoxy resins may include YDCN-500-1P, YDCN-500-2P, YDCN-500-4P, YDCN-500-5P, YDCN-500-7P, YDCN-500-8P, YDCN-500-10P, YDCN-500-80P, YDCN-500-80PCA60, YDCN-500-80PBC60, YDCN-500-90P, YDCN-500-90PA75 (Kukdo Chemical Co., Ltd.); EOCN-102S, EOCN-103S, EOCN-104S, EOCN-1012, EOCN-1025, EOCN-1027 (Nippon Kayaku Co., Ltd.); YDCN-701, YDCN-702, YDCN-703, YDCN-704 (Tohto Kagaku Co., Ltd.); Epiclon N-665-EXP (Dainippon Ink and Chemicals, Inc.), and the like. Examples of bisphenol novolac epoxy resins may include KBPN-110, KBPN-120, KBPN-115 (Kukdo Chemical Co., Ltd.), etc. Examples of multifunctional epoxy resins include Epon 1031S (Yuka Shell Epoxy Co., Ltd.); Araldite 0163 (Ciba Specialty Chemicals); Detachol EX-611, Detachol EX-614, Detachol EX-614B, Detachol EX-622, Detachol EX-512, Detachol EX-521, Detachol EX-421, Detachol EX-411, Detachol EX-321 (NAGA Celsius Temperature Kasei Co., Ltd.); EP-5200R, KD-1012, EP-5100R, KD-1011, KDT-4400A70, KDT-4400, YH-434L, YH-434, YH-300 (Kukdo Chemical Co., Ltd.), and the like. Examples of amine epoxy resins may include EPIKOTE 604 (Yuka Shell Epoxy Co., Ltd.); YH-434 (Tohto Kagaku Co., Ltd.); TETRAD-X and TETRAD-C (Mitsubishi Gas Chemical Company Inc.); ELM-120 (Sumitomo Chemical Industry Co., Ltd.), and the like. An example of a heterocyclic epoxy resin may include PT-810 (Ciba Specialty Chemicals). Examples of substituted epoxy resins may include ERL-4234, ERL-4299, ERL-4221, ERL-4206 (UCC Co., Ltd.), and the like. Examples of naphthol epoxy resins may include Epiclon HP-4032, Epiclon HP-4032D, Epiclon HP-4700, and Epiclon HP-4701 (Dainippon Ink and Chemicals, Inc.). Examples of non-phenolic epoxy resins may include YX-4000H (Japan Epoxy Resin), YSLV-120TE, GK-3207 (Nippon steel chemical), NC-3000 (Nippon Kayaku), and the like. The epoxy resins may be used alone or as a mixture thereof.

The epoxy resin may be present in the composition in an amount of about 10 to about 25% by weight, e.g. about 12 to about 20% by weight, based on the total solid content of the composition. Within this range, high reliability and excellent mechanical properties may be attained.

Curing Agents

The curing agents may include two kinds of curing agents having different reaction temperature zones from one another.

In an implementation, the curing agents may include a phenolic curing agent and an amine curing agent.

The phenolic curing agent may include biphenyl groups in a main chain thereof. For example, the phenolic curing agent may have a structure of, e.g., may be represented by, Formula 1, below.

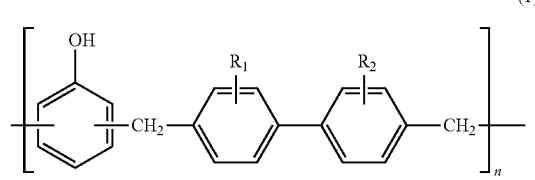

In Formula 1, $R_1$ and $R_2$ may each independently be a $C_1$-$C_6$ alkyl group and n may be about 2 to about 100.

Examples of such phenolic curing agents may include MEH-7851SS, MEH-7851S, MEH-7851M, MEH-7851H, and MEH-78514H, which are commercially available from Meiwa Plastic Industries Co., Ltd.

The phenolic curing agent may be present in the composition in an amount of about 0.5 to about 14% by weight, e.g., about 1 to about 10% by weight, based on the total solid content of the composition. Within this range, a number of voids after one cycle may be effectively reduced.

The amine curing agent may include an aromatic diamine-based curing agent. For example, the amine curing agent may be represented by Formula 2, below.

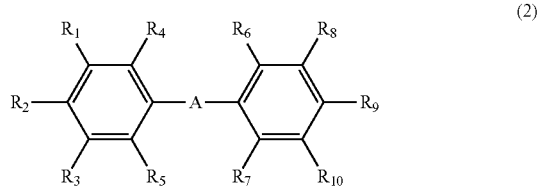

(2)

In Formula 2, A may be a single bond or may be selected from the group of —CH$_2$—, —CH$_2$CH$_2$—, —SO$_2$—, —NHCO—, —C(CH$_3$)$_2$—, and —O—, and R$_1$ to R$_{10}$ may each independently be selected from hydrogen, C$_1$-C$_4$ alkyl groups, C$_1$-C$_4$ alkoxy groups, and amine groups. In an implementation, at least two of R$_1$ to R$_{10}$ may be amine groups.

Examples of amine curing agents may include 3,3'-diaminobenzidine, 4,4'-diaminodiphenylmethane, 4,4' or 3,3'-diaminodiphenylsulfone, 4,4'-diaminobenzophenone, p-phenylenediamine, m-phenylenediamine, m-toluenediamine, 4,4'-diaminodiphenyl ether, 4,4' or 3,3'-diaminobenzophenone, 1,4' or 1,3'-bis(4 or 3-aminocumyl)benzene, 1,4'bis(4 or 3-aminophenoxy)benzene, 2,2'-bis[4-(4 or 3-aminophenoxy)phenyl]propane, bis[4-(4 or 3-aminophenoxy)phenyl]sulfone, 2,2'-bis[4-(4 or 3-aminophenoxy)phenyl]hexafluorosulfone, 2,2'-bis[4-(4 or 3-aminophenoxy)phenyl]hexafluoropropane, 4,4'-diamino-3,3',5,5'-tetrabutyldiphenylketone, 4,4'-diamino-3,3',5,5'-tetraethyldiphenylketone, 4,4'-diamino-3,3',5,5'-tetra-n-propylenediphenylketone, 4,4'-diamino-3,3',5,5'-tetraisopropyldiphenylketone, 4,4'-diamino-3,3',5,5'-tetramethyldiphenylketone, 4,4'-diamino-3,3',5,5'-tetra-n-propyldiphenylmethane, 4,4'-diamino-3,3'5,5-tetramethyldiphenylmethane, 4,4'-diamino-3,3'5,5'-tetraisopropyldiphenylmethane, 4,4'-diamino-3,3'5,5'-tetraethyldiphenylmethane, 4,4'-diamino-3,3'-dimethyl-5,5'-diethyldiphenylmethane, 4,4'-diamino-3,3'-dimethyl-5,5'-diisopropyldiphenylmethane, 4,4'-diamino-3,3'-diethyl-5,5'-diethyldiphenylmethane, 4,4'-diamino-3,5'-dimethyl-3',5'-diethyldiphenylmethane, 4,4'-diamino-3,5-dimethyl-3',5'-diisopropyldiphenylmethane, 4,4'-diamino-3,5-diethyl-3',5'-dibutyldiphenylmethane, 4,4'-diamino-3,5-diisopropyl-3',5'-dibutyldiphenylmethane, 4,4'-diamino-3,3'-diisopropyl-5,5'-dibutyldiphenylmethane, 4,4'-diamino-3,3'-dimethyl-5',5'-dibutyldiphenylmethane, 4,4'-diamino-3,3'-diethyl-5',5'-dibutyldiphenylmethane, 4,4'-diamino-3,3'-dimethyldiphenylmethane, 4,4'-diamino-3,3'-diethyldiphenylmethane, 4,4'-diamino-3,3'-di-n-propyldiphenylmethane, 4,4'-diamino-3,3'-diisopropyldiphenylmethane, 4,4'-diamino-3,3'-dibutyldiphenylmethane, 4,4'-diamino-3,3',5-trimethyldiphenylmethane, 4,4'-diamino-3,3',5-triethyldiphenylmethane, 4,4'-diamino-3,3',5-tri-n-propyldiphenylmethane, 4,4'-diamino-3,3',5-triisopropyldiphenylmethane, 4,4'-diamino-3,3',5-tributyldiphenylmethane, 4,4'-diamino-3-methyl-3'-ethyldiphenylmethane, 4,4'-diamino-3-methyl-3'-isopropyldiphenylmethane, 4,4'-diamino-3-methyl-3'-butyldiphenylmethane, 4,4'-diamino-3-isopropyl-3'-butyldiphenylmethane, 2,2-bis(4-amino-3,5-dimethylphenyl)propane, 2,2-bis(4-amino-3,5-diethylphenyl)propane, 2,2-bis(4-amino-3,5-di-n-propylphenyl)propane, 2,2-bis(4-amino-3,5-diisopropylphenyl)propane, 2,2-bis(4-amino-3,5-dibutylphenyl)propane, 4,4'-diamino-3,3',5,5'-tetramethyldiphenylbenzanilide, 4,4'-diamino-3,3',5,5'-tetraethyldiphenylbenzanilide, 4,4'-diamino-3,3',5,5'-tetra-n-propyldiphenylbenzanilide, 4,4'-diamino-3,3',5,5'-tetraisopropyldiphenylbenzanilide, 4,4'-diamino-3,3',5,5'-tetrabutyldiphenylbenzanilide, 4,4'-diamino-3,3',5,5'-tetramethyldiphenylsulfone, 4,4'-diamino-3,3',5,5'-tetraethyldiphenylsulfone, 4,4'-diamino-3,3',5,5'-tetra-n-propyldiphenylsulfone, 4,4'-diamino-3,3',5,5'-tetraisopropyldiphenylsulfone, 4,4'-diamino-3,3',5,5'-tetramethyldiphenylether, 4,4'-diamino-3,3',5,5'-tetraethyldiphenylether, 4,4'-diamino-3,3',5,5'-tetra-n-propyldiphenylether, 4,4'-diamino-3,3',5,5'-tetraisopropyldiphenylether, 4,4'-diamino-3,3',5,5'-tetrabutyldiphenylether, 3,3'-diaminobenzophenone, 3,4-diaminobenzophenone, 3,3'-diaminodiphenylether, 3,3'-diaminodiphenylmethane, 3,4'-diaminodiphenylmethane, 2,2'-diamino-1,2-diphenylethane or 4,4'-diamino-1,2-diphenylethane, 2,4-diaminodiphenylamine, 4,4'-diamino-octafluorobiphenyl, o-dianisidine, and the like.

The amine curing agent may be present in the composition in an amount of about 1 to about 10% by weight, e.g., about 3 to about 7% by weight, based on the total solid content of the composition. Within this range, a number of voids after one cycle may be effectively reduced.

The phenolic curing agent and the amine curing agent may be present in the composition in a weight ratio of about 3:1 to about 1:11. Within this range, the occurrence of voids after one cycle and after molding may be minimized.

Curing Catalyst

The adhesive composition for semiconductors may include a curing catalyst. The curing catalyst may include a suitable curing catalyst that selectively promotes the curing reaction of the curing agent activated in a lower reaction temperature zone without attacking or adversely affecting the curing agent having a higher reaction temperature zone. For example, the curing catalyst may include a phosphorus-containing catalyst that does not attack or adversely affect the amine curing agent.

A phosphine-based curing catalyst may be used as the phosphorus-containing catalyst. Examples of the phosphine-based curing catalyst may include TBP, TMTP, TPTP, TPAP, TPPO, DPPE, DPPP, and DPPB, which are commercially available from HOKKO Chemical Industry Co., Ltd.

In an implementation, the curing catalyst may have a reaction temperature zone different from that of the amine curing agent and may have a melting point of about 90 to about 320° C. In an implementation, the curing catalyst may have a melting point of about 100 to about 200° C. Within this range, two separate curing zones may appear.

The curing catalyst may be present in the composition in an amount of about 0.1 to about 10% by weight, e.g., about 0.5 to about 7% by weight, based on the total solids content of the composition. Within this range, excellent heat resistance, flowability, and connection performance may be attained without causing a rapid reaction of the epoxy resin.

Silane Coupling Agent

The adhesive composition for semiconductors may further include a silane coupling agent. The silane coupling agent may function as an adhesion promoter to help enhance adhesion between a surface of an inorganic material, e.g., fillers, and organic materials via chemical coupling therebetween during blending of the composition.

The silane coupling agent may include, e.g., epoxy group-containing silane coupling agents, such as 2-(3,4-epoxycyclohexyl)-ethyltrimethoxysilane, 3-glycidoxytrimethoxysilane and 3-glycidoxypropyltriethoxysilane; amine group-containing silane coupling agents, such as N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethylbutylidene)propylamine and N-phenyl-3-aminopropyltrimethoxysilane; mercapto-containing silane coupling agents, such as 3-mercaptopropylmethyldimethoxysilane and 3-mercaptopropyltriethoxysilane; and isocyanate-containing silane coupling agents, such as 3-isocyanatepropyltriethoxysilane. The silane coupling agents may be used alone or as a mixture of two or more thereof.

The coupling agent may be present in the composition in an amount of about 0.01 to about 5% by weight, e.g., about 0.1 to about 3% by weight or about 0.5 to about 2% by weight, based on the total solid content of the adhesive composition. Within this range, high adhesion reliability may be obtained, and the occurrence of air bubbles may be reduced.

Filler

The composition may further include fillers. Examples of suitable fillers may include metal powders, such as gold, silver, copper, and nickel powders; and inorganic compounds, such as alumina, aluminum hydroxide, magnesium hydroxide, calcium carbonate, magnesium carbonate, calcium silicate, magnesium silicate, calcium oxide, magnesium oxide, aluminum oxide, aluminum nitride, silica, boron nitride, titanium dioxide, glass, iron oxide, and ceramics. In an implementation, the filler may include silica.

There is no particular restriction as to the shape and size of the filler. In an implementation, the filler may include spherical silica or amorphous silica. A particle size of the silica may be about 5 nm to about 20 μm.

The fillers may be present in the composition in an amount of about 10 to about 60% by weight, e.g., about 15 to about 40% by weight, based on the total solid content of the adhesive composition. Within this range, high flowability, excellent film-forming properties, and excellent adhesiveness may be obtained.

Solvent

The adhesive composition may further include a solvent. The solvent may help reduce a viscosity of the adhesive composition, thereby facilitating film formation. Examples of suitable solvents may include toluene, xylene, propylene glycol monomethyl ether acetate, benzene, acetone, methyl ethyl ketone, tetrahydrofuran, dimethylformamide, and cyclohexanone.

An embodiment provides an adhesive film for semiconductors including or prepared using the adhesive composition. There is no need for a special apparatus or equipment for forming an adhesive film for semiconductors using the adhesive composition according to an embodiment, and a suitable method generally may be used to manufacture the adhesive film. For example, the respective components may be dissolved in the solvent, and sufficiently kneaded using a beads-mill, followed by depositing the resultant on a polyethylene terephthalate (PET) film subjected to release treatment, and drying in an over at 100° C. for 10~30 minutes to prepare an adhesive film having a suitable thickness.

In an implementation, the adhesive film for semiconductors may include a base film, an adhesive layer, a bonding layer, and a protective film, which are sequentially stacked in this order.

In the adhesive film according to the present embodiment, the adhesive film may have a thickness of about 5 μm to about 200 μm, e.g., about 10 μm to about 100 μm. Within this range, the adhesive film may exhibit sufficient adhesion while providing economic feasibility. In an implementation, the adhesive film may have a thickness of about 15 μm to about 60 μm.

The adhesive layer and the adhesive film prepared using the adhesive composition according to an embodiment may have two discrete curing zones, thereby reducing or eliminating the semi-curing process and the PMC process after bonding the same kind of semiconductor chip, while suppressing void generation after 1 cycle.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES 1 TO 10

Preparation of Adhesive Composition for Semiconductors

A solvent (I: cyclohexanone) was added to an acrylic resin, an epoxy resin, a curing agent, a curing catalyst, fillers, and a silane coupling agent, as listed in Table 1, below, such that the solid content in the solution was 40% by weight, followed by kneading using a beads-mill, thereby preparing an adhesive composition for semiconductors.

COMPARATIVE EXAMPLES 1-3

Preparation of Adhesive Composition for Semiconductors

Adhesive compositions for semiconductor were prepared in the same manner as in Examples 1 to 10, except for some components as listed in Table 2, below.

Specification of respective components used in the Examples and the Comparative Examples were as follows:

(A) Thermoplastic resin: SG-P3 (Nagase Chemtex Co., Ltd.)

(B1) Epoxy resin: YDCN-500-90P (Kukdo Kayaku Co., Ltd.)

(B2) Epoxy resin: NC-3000 (Nippon Kayaku Co., Ltd.)

(C) Phenol curing agent: MEH-7851SS (Meiwa Chemicals Co., Ltd.)

(D) Amine curing agent: DDS (Wako Co., Ltd., gram-equivalent weight: 65)

(E) Silane coupling agent: KBM-403 (Shinetsu Co., Ltd.)

(F) Curing catalyst: TTP-K, (HOKKO Chemical Industry Co., Ltd.)

(G) Filler: SO-25H (ADMATECH Co., Ltd.)

(H) Solvent: Cyclohexanone

TABLE 1

|  | Example 1 | Example 2 | Example 3 | Example 4 | Example 5 | Example 6 | Example 7 | Example 8 | Example 9 | Example 10 |
|---|---|---|---|---|---|---|---|---|---|---|
| $A^1$ | 36.9 | 32 | 27 | 32 | 16.0 | 59.5 | 32.8 | 31.4 | 29.9 | 28.6 |
| $B1^2$ | 0 | 0 | 0 | 10 | 0.0 | 0.0 | 0.0 | 0.0 | 0.0 | 0.0 |
| $B2^3$ | 20 | 20 | 20 | 10 | 24.7 | 11.9 | 20.5 | 19.6 | 18.7 | 17.9 |
| $C^4$ | 3 | 3 | 3 | 3 | 3.7 | 1.8 | 0.5 | 4.9 | 9.3 | 13.4 |
| $D^5$ | 5 | 5 | 5 | 5 | 6.2 | 3.0 | 5.1 | 4.9 | 4.7 | 4.5 |
| $E^6$ | 1 | 1 | 1 | 1 | 1.2 | 0.6 | 1.0 | 1.0 | 0.9 | 0.9 |
| $F^7$ | 0.1 | 5 | 10 | 5 | 6.2 | 3.0 | 5.1 | 4.9 | 4.7 | 4.5 |
| $G^8$ | 34 | 34 | 34 | 34 | 42.0 | 20.2 | 34.9 | 33.3 | 31.8 | 30.4 |
| Total (parts by weight) | 100 | 100 | 100 | 100 | 100 | 100 | 100 | 100 | 100 | 100 |

TABLE 2

|  | Comparative Example 1 | Comparative Example 2 | Comparative Example 3 |
|---|---|---|---|
| A | 37 | 32 | 32 |
| B1 | 0 | 0 | 0 |
| B2 | 20 | 20 | 20 |
| C | 3 | 0 | 8 |
| D | 5 | 8 | 0 |
| E | 1 | 1 | 1 |
| F | 0 | 5 | 5 |
| G | 34 | 34 | 34 |
| Total (parts by weight) | 100 | 100 | 100 |

Preparation of Adhesive Film

Each of the adhesive compositions prepared in Examples 1 to 10 and Comparative Examples 1 to 3 was deposited on a PET film subjected to releasing treatment using an applicator, followed by drying in an oven at 100° C. for 10~30 minutes, thereby providing a 60 μm thick adhesive film.

EXPERIMENTAL EXAMPLE

Evaluation of Physical Properties of Adhesive Film Prepared Using Adhesive Composition in Examples and Comparative Examples Physical properties of each of the adhesive films prepared using the adhesive compositions of Examples 1 to 10 and Comparative Examples 1 to 3 were evaluated by the following method, and results are provided in Tables 5 and 6, below. Curing heating value was measured using a differential scanning calorimeter (DSC), and the presence of void after 1 cycle and molding was determined by scanning acoustic tomography (SAT). After reflow resistance testing, cracking was observed with the naked eye and die share strength was measured.

(1) Curing heating value and exothermic peak height: Curing heating value of the prepared adhesive composition was measured by DSC. The temperature elevation rate was 10° C./min and scanning was performed from 0 to 350° C.

The exothermic peak height refers to a peak height of the exothermic peak as measured by DSC. The curing heating value of the prepared adhesive composition was measured by DSC. Here, the height of the first exothermic peak zone refers to a height from a starting point of the first exothermic peak zone to a peak point of the first exothermic peak zone, and the height of the second exothermic peak zone refers to a height from a starting point of the first exothermic peak to a peak point of the second exothermic peak zone. The peak height was measured in W/g. The weight of the sample was 5 mg and the temperature was elevated at a rate of 10° C./min while scanning the sample from 0 to 350° C.

(2) Void Rate after 1 cycle and molding (void proportion of less than 10%)

With a polished wafer placed on a hot plate of a mounter and subjected to removal of foreign matter using isopropyl alcohol (IPA), a mirror plane of the wafer was placed on an adhesive surface of an adhesive film. Here, a mounter temperature was set to 60° C., which is a general surface temperature. The wafer-adhesive film assembly was cut to a chip size of 10×10 mm by sawing, and attached at 120° C. and 1 kgf/1 sec to a PCB, which had been subjected to pre-treatment under conditions of Table 3, below, thereby preparing chips each having an adhesive on one side thereof.

TABLE 3

| PCB: 62 mm one shot PCB |
| PCB baking: in an oven at 120° C. for 1 hour |
| Plasma treatment after baking |

Next, EMC molding and curing were performed under conditions of Table 4, below, followed by measuring a proportion of voids.

TABLE 4

| EMC Tablet: Cheil Industries EMC SG-8500BC | | | | |
|---|---|---|---|---|
| Mold temperature | Clamp pressure | Transfer pressure | Transfer time | Curing time |
| 175° C. | 30 ton | 1.1 ton | 18 sec | 60 sec |

Then, the resultant was divided into respective units using a saw, followed by removal of PCB and grinding the resultant using a grinder until the adhesive layer of the adhesive film was exposed, for measurement of the void proportion after molding. Here, in order to facilitate void observation, the resultant was ground such that a solder resist layer of the PCB partially remained to the point of being semi-transparent.

Voids on the adhesive layer exposed by grinding were observed by scanning acoustic tomography (SAT). To measure the number of voids, a lattice counting method was used. Specifically, a total area of the resultant chip was divided into 10 lattice rows and 10 lattice columns in longitudinal and transverse directions, and a number of lattices including the voids was counted and converted into %. When the void proportion was less than 10%, the test result was determined as void removal, and when the void proportion was 10% or more, the test result was determined as no void removal.

(3) Die deviation after 1 cycle and molding: Each of the prepared films was mounted on a 100 μm thick wafer coated with a dioxide layer and cut into chips having a size 8×8 mm and a size 10×10 mm. Then, the chips were attached in two layers to a QDP package. After performing 1 cycle of semi-curing, the resulting package was molded with an EMC (SG-8500BC, Cheil Industries, Korea) at 175° C. for 60 seconds. Then, die deviation was observed by scanning acoustic tomography (SAT). 10% or more deviation from an original attachment position was determined as deviation.

(4) Die shear strength: A 530 μm thick wafer coated with a dioxide layer was cut into chips having a size of 5 mm×5 mm. The chips were laminated with each of the adhesive films at 60° C., which in turn was cut to leave behind a bonded portion only. An upper chip having a size of 5×5 mm was placed on an Alloy 42 frame having a size of 10×10 mm, followed by applying a force of 1 kgf on a hot plate at 120° C. for 1 second and curing at 175° C. for 60 minutes after 1 cycle of curing, which consisted of curing in an oven at 150° C. for 10 minutes and curing on the hot plate at 150° C. for 30 minutes. The prepared specimen was allowed to absorb moisture at 85° C./85%RH for 168 hours, and reflow was performed three times at a maximum temperature of 260° C. Then, the die shear strength was measured at 250° C. using DAGE 4000.

(5) Void proportion after 1 cycle: The prepared adhesive composition was formed into a 50~60 μm thick film containing a solvent in a remaining amount of less than 1% and was laminated between slide glasses (18×18 mm) at 60° C., followed by 1 cycle of curing, which consisted of curing in an oven at 150° C. for 10 minutes and curing on a hot plate at 150° C. for 30 minutes. After photographing the film using a microscope (magnification: 25X), an area of voids with respect to a total area was digitalized through image analysis.

Void proportion after 1 cycle (%)=(Void area/Total area)×100

(6) Reflow resistance test: Each adhesive film was mounted on a 100 μm thick wafer and cut into chips having a size 8×8 mm and a size 10×10 mm. The chips were attached in two layers to a QDP package. The resulting package was molded with an EMC (SG-8500BC, Cheil Industries, Korea) at 175° C. for 60 seconds, followed by post-curing in an oven at 175° C. for 2 hours. The prepared specimen was allowed to absorb moisture at 85° C./85%RH for 168 hours, and reflow was conducted three times at a maximum of 260° C. Then, cracks were observed on the specimen.

TABLE 5

| | Curing cycle | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|
| Curing exothermic zone (curing peak number) | 0 cycle (initial) | 2 | 2 | 2 | 2 | 2 | 2 | 2 | 2 | 2 | 2 |
| curing exothermic zone and heating value, exothermic peak height (1st exothermic peak) | | 120-185° C. 30 J/g 0.372 W/g | 100-165° C. 30 J/g 0.372 W/g | 70-155° C. 30 J/g 0.372 W/g | 90-165° C. 40 J/g 0.424 W/g | 95-165° C. 50 J/g 0.484 W/g | 138-185° C. 20 J/g 0.213 W/g | 123-185° C. 10 J/g 0.077 W/g | 100-165° C. 35 J/g 0.392 W/g | 70-155° C. 40 J/g 0.424 W/g | 65-155° C. 50 J/g 0.484 W/g |
| curing exothermic zone and heating value, exothermic peak height (2nd exothermic peak) | | 185-350° C. 60 J/g 0.523 W/g | 165-350° C. 60 J/g 0.523 W/g | 155-350° C. 60 J/g 0.523 W/g | 165-350° C. 70 J/g 0.589 W/g | 165-350° C. 80 J/g 0.612 W/g | 185-350° C. 55 J/g 0.501 W/g | 185-350° C. 80 J/g 0.612 W/g | 165-350° C. 60 J/g 0.523 W/g | 155-350° C. 60 J/g 0.523 W/g | 155-350° C. 60 J/g 0.523 W/g |

| | Curing cycle | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|
| Curing exothermic zone (curing peak number) | 1 cycle | 2 | 1 | 1 | 1 | 1 | 1 | 1 | 1 | 1 | 1 |
| curing exothermic zone and heating value, exothermic peak height (1st exothermic peak) | | 100-185° C. 9 J/g 0.065 W/g | 100-165° C. 0 J/g — | 70-155° C. 0 J/g — | 90-165° C. 0 J/g — | 95-165° C. 0 J/g — | 138-185° C. 0 J/g — | 123-185° C. 0 J/g — | 100-165° C. 0 J/g — | 70-155° C. 0 J/g — | 65-155° C. 0 J/g — |
| curing exothermic zone and heating value, exothermic peak height (2nd exothermic peak) Foam void after 1 cycle | | 185-350° C. 60 J/g 0.523 W/g 0.9 | 165-350° C. 55 J/g 0.501 W/g 3.8 | 155-350° C. 50 J/g 0.484 W/g 6.8 | 165-350° C. 60 J/g 0.523 W/g 2.1 | 165-350° C. 70 J/g 0.589 W/g 15 | 185-350° C. 55 J/g 0.501 W/g 0.2 | 185-350° C. 80 J/g 0.612 W/g 10.5 | 165-350° C. 56 J/g 0.517 W/g 11.7 | 155-350° C. 58 J/g 0.517 W/g 14.9 | 155-350° C. 50 J/g 0.484 W/g 14.5 |

| | Curing cycle | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|
| Void proportion after 1 cycle and molding (void proportion | Observation after molding | removed | removed | removed | removed | removed | removed | removed | removed | removed | removed |

TABLE 5-continued

| | | | | | | | | | | |
|---|---|---|---|---|---|---|---|---|---|---|
| of less than 10%: void removal) | | | | | | | | | | |
| Die deviation after 1 cycle and molding | | No occurrence | No occurrence | No occurrence | No occurrence | No occurrence | No occurrence | No occurrence | No occurrence | No occurrence | No occurrence |
| Die shear after reflow kgf/chip | (Final) | 12 | 14.3 | 17.8 | 20.1 | 16.8 | 15.2 | 14.3 | 16.6 | 17.8 | 18.2 |
| Reflow resistance test (Cracking) | | No cracking | No cracking | No cracking | No cracking | No cracking | No cracking | No cracking | No cracking | No cracking | No cracking |

| | Curing cycle | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|
| Void proportion after 1 cycle and molding (void proportion of less than 10%: void removal) | Observation after molding | removed | removed | removed | removed | removed | removed | removed | removed | removed | removed |
| Die deviation after 1 cycle and molding | | No occurrence | No occurrence | No occurrence | No occurrence | No occurrence | No occurrence | No occurrence | No occurrence | No occurrence | No occurrence |
| Die shear after reflow kgf/chip | (Final) | 12 | 14.3 | 17.8 | 20.1 | 16.8 | 15.2 | 14.3 | 16.6 | 17.8 | 18.2 |
| Reflow resistance test (Cracking) | | No cracking | No cracking | No cracking | No cracking | No cracking | No cracking | No cracking | No cracking | No cracking | No cracking |

0 cycle was defined as a state of the adhesive composition before curing
1 cycle was defined as a curing process consisting of curing in an oven at 150° C. for 10 minutes and curing on a hot plate at 150° C. for 30 minutes (simulating semi-curing and wire bonding, respectively)
Final process consisted of curing in an oven at 150° C. for 10 minutes, curing on a hot plate at 150° C. for 30 minute, and curing in an oven at 175° C. for 60 seconds (simulating PMC process after EMC molding)

TABLE 6

| | Curing cycle | Comparative Example 1 | Comparative Example 2 | Comparative Example 3 |
|---|---|---|---|---|
| Curing exothermic zone (curing peak number) | 0 cycle (initial) | 1 | 1 | 1 |
| curing exothermic zone and heating value, exothermic peak height (temperature zone 1st peak) | | No | No | No |
| | | 0 J/g | 0 J/g | 0 J/g |
| | | 0 W/g | 0 W/g | 0 W/g |
| curing exothermic zone and heating value, exothermic peak height (temperature zone 2nd peak) | | 120-350° C. | 120-350° C. | 120-350° C. |
| | | 90 J/g | 90 J/g | 90 J/g |
| | | 0.693 W/g | 0.693 W/g | 0.693 W/g |
| curing exothermic zone (curing peak number) | 1 cycle | 1 | 1 | 1 |
| curing exothermic zone and heating value, exothermic peak height (1$^{st}$ exothermic peak) | | No | No | No |
| | | 0 J/g | 0 J/g | 0 J/g |
| | | 0 W/g | 0 W/g | 0 W/g |

TABLE 6-continued

|  | Curing cycle | Comparative Example 1 | Comparative Example 2 | Comparative Example 3 |
|---|---|---|---|---|
| curing exothermic zone and heating value, exothermic peak height ($2^{nd}$ exothermic peak) |  | 120-350° C. | 120-350° C. | 120-350° C. |
|  |  | 90 J/g | 80 J/g | 70 J/g |
|  |  | 0.693 W/g | 0.612 W/g | 0.589 W/g |
| Foam void after 1 cycle (%) |  | 33.5 | 35.5 | 18.5 |
| Void proportion after 1 cycle and molding (void proportion of less than 10%: void removal) | Observation after molding | Immeasurable | Not removed | Not removed |
| Die deviation after 1 cycle and molding |  | Occurrence | No occurrence | No occurrence |
| Die shear after reflow kgf/chip | (Final) | 5.6 | 4.3 | 16.9 |
| Reflow resistance test (Cracking) |  | Cracking | Cracking | Cracking |

As shown in Tables 5 and 6, the adhesive compositions of Examples 1 to 10 had two exothermic peak zones and, after 1 cycle of curing, the first exothermic peak zone at a lower reaction temperature range had a curing rate ranging from 70% to 100% as measured by Equation 1 and the peak height reduction rate of the first exothermic peak zone was in the range from 70% to 100%, as measured by Equation 2.

Further, the adhesive compositions of Examples 1 to 10 had a void proportion of less than 15% after 1 cycle of curing. On the contrary, for the adhesive compositions of Comparative Examples 1 to 3, a single exothermic peak appeared at a temperature of 65~350° C., the void proportion after 1 cycle of curing was very high, and cracking occurred in the reflow resistance test.

By way of summation and review, when chips of the same size are stacked in a vertical direction in semiconductor packaging, spacers may be bonded to the chips (prior to stacking) to secure a space for wire bonding. Thus, a separate bonding process may be included, causing inconvenience. In order to simplify the process, directly providing a bonding wire of a lower chip to an adhesive film (to be attached to a lower surface of an upper chip) has been considered. Thus, an adhesive layer may exhibit flowability to facilitate penetration of the adhesive layer by the bonding wire at a chip bonding temperature (e.g., about 100 to 150° C.). Maintaining sufficient flowability of the adhesive layer may help reduce and/or prevent quality degradation, e.g., wire collapse or compression.

Thus, adhesives exhibiting high flowability may be used instead of adhesives exhibiting low flowability, which may not be able to receive a bonding wire therein. However, an adhesive layer having high flowability may form voids at an interface between the adhesive layer and a surface of a substrate, as excessive adhesion of the adhesive layer results from high flowability of the adhesive, low flatness to the bonding surface is caused by curling of chips in a chip bonding process, or the substrate has an irregular surface. During semi-curing or EMC molding, the voids may be immobilized instead of being removed, thereby causing a defect in a semiconductor chip package or reliability deterioration under severe conditions. Thus, although semi-curing may be performed after attaching the same kind of chip, such an operation may be inconvenient due to addition of the process and may cause a reduction in productivity. In particular, semi-curing may be performed for a long time of at least 1 hour at 150° C., e.g., for 1.5 to 2 hours at 150° C., causing productivity deterioration. Thus, improved production efficiency through time reduction or elimination of semi-curing after chip bonding may be desirable. However, simply reducing the time of the semi-curing may increase the void proportion. In addition, a post-molding cure (PMC) process may be performed for 2 hours at 175° C. to complete curing after die-attachment and EMC molding.

The embodiments provide an adhesive composition for semiconductors that improves production efficiency by reducing time for a series of semiconductor processes including, e.g., die-attaching, EMC molding and PMC molding, without deteriorating properties of adhesives for semiconductors, thereby providing highly reliable products.

The embodiments provide an adhesive composition for semiconductors that has two discrete curing zones such that low temperature curing and high temperature curing may be separately carried out at the same time, thereby facilitating elimination or a time reduction of semi-curing and post mold curing (PMC). For example, a reduction of the void proportion to 15% or less after 1 cycle may be achieved (wherein the void could otherwise be formed when omitting the semi-curing process).

The embodiments provide an adhesive composition for semiconductors capable of reducing or eliminating a semi-curing process after a chip bonding process.

The embodiments provide an adhesive composition that may prevent or minimize void generation after 1 cycle (which void could otherwise be formed when shortening or eliminating the semi-curing process).

The embodiments provide an adhesive composition for semiconductors that facilitates efficient removal of voids in EMC molding by imparting a residual curing rate after various curing processes following die attaching.

The embodiments provide an adhesive composition for semiconductors that facilitates elimination of a PMC process (for 2 hours at 175° C.).

The embodiments provide an adhesive composition for semiconductors that may also be applied to FOW requiring penetration characteristics of a bonding wire.

The embodiments provide an adhesive composition for semiconductors that may reduce and/or eliminate void generation in EMC molding, thereby satisfying desired processability and reliability for bonding the same kind of semiconductor chips.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. An adhesive composition for semiconductors, the adhesive composition exhibiting two exothermic peaks at temperatures ranging from 65° C. to 350° C., wherein:
   a first exothermic peak appears at a lower temperature than a second exothermic peak, and
   the adhesive composition has a curing rate of about 70% to 100% in a first exothermic peak zone, as calculated by Equation 1:

Curing rate=[(Heating value upon 0 cycle−Heating value after 1 cycle)/Heating value upon 0 cycle]× 100.

2. The adhesive composition as claimed in claim 1, wherein the adhesive composition has a curing rate of 0 to about 20% in a second exothermic peak zone, as calculated by Equation 1.

3. The adhesive composition as claimed in claim 1, wherein the first exothermic peak appears at a temperature of about 65° C. to about 185° C. and the second exothermic peak appears at a temperature of about 155° C. to about 350° C.

4. The adhesive composition as claimed in claim 1, wherein the adhesive composition includes:
   a thermoplastic resin,
   an epoxy resin,
   curing agents, the curing agents including two kinds of curing agents activated in different reaction temperature zones, and
   a curing catalyst, the curing catalyst selectively promoting a curing reaction of the curing agent activated in a lower reaction temperature zone.

5. The adhesive composition as claimed in claim 4, wherein:
   the curing agents include a phenolic curing agent and an amine curing agent, and
   the curing catalyst includes a phosphorus-containing catalyst.

6. The adhesive composition as claimed in claim 5, wherein:
   the phenolic curing agent is represented by Formula 1:

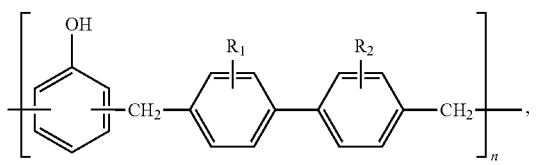

(1)

and
   in Formula 1, $R_1$ and $R_2$ are each independently a $C_1$-$C_6$ alkyl group and n is about 2 to about 100.

7. The adhesive composition as claimed in claim 5, wherein:
   the amine curing agent is represented by Formula 2:

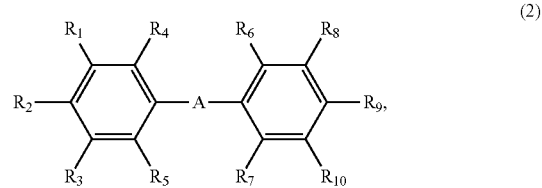

(2)

and
   in Formula 2, A is a single bond or is selected from the group of —$CH_2$—, —$CH_2CH_2$—, —$SO_2$—, —NHCO—, —$C(CH_3)_2$—, and —O—, and $R_1$ to $R_{10}$ are each independently selected from hydrogen, $C_1$-$C_4$ alkyl groups, $C_1$-$C_4$ alkoxy groups, and amine groups, provided that at least two of $R_1$ to $R_{10}$ are amine groups.

8. The adhesive composition as claimed in claim 5, wherein the phenolic curing agent and the amine curing agent are present in the composition in a weight ratio of about 3:1 to about 1:11.

9. The adhesive composition as claimed in claim 4, further comprising fillers and a silane coupling agent.

10. An adhesive composition for semiconductors, the adhesive composition exhibiting two exothermic peaks at temperatures ranging from 65° C. to 350° C., wherein:
    a first exothermic peak appears at a lower temperature than a second exothermic peak, and
    the adhesive composition has a void proportion of 15% or less after 1 cycle.

11. The adhesive composition as claimed in claim 10, wherein:
    the first exothermic peak appears at a temperature ranging from about 65° C. to about 185° C., and
    the second exothermic peak appears at a temperature ranging from about 155° C. to about 350° C.

12. The adhesive composition as claimed in claim 10, wherein the adhesive composition includes:
    about 16 to about 65 wt % of a thermoplastic resin,
    about 10 to about 25 wt % of an epoxy resin,
    about 0.5 to about 14 wt % of a phenolic curing agent,
    about 1 to about 10 wt % of an amine curing agent,
    about 0.1 to about 10 wt % of a phosphorus-containing catalyst,
    about 0.14 to about 5 wt % of a silane coupling agent, and
    about 10 to about 60 wt % of fillers, all wt % being based on a total solid content of the composition.

13. An adhesive composition for semiconductors, the adhesive composition exhibiting two exothermic peaks at temperatures ranging from 65° C. to 350° C., wherein:
    a first exothermic peak appears at a lower temperature than a second exothermic peak, and
    the adhesive composition has a peak height reduction rate of about 70% to 100% in a first exothermic peak zone, as calculated by Equation 2:

Peak height reduction rate=[(Peak height upon 0 cycle−Peak height after 1 cycle)/Peak height upon 0 cycle]×100.

14. The adhesive composition as claimed in claim 13, wherein the adhesive composition has a peak height reduction rate of 0% to about 20% in a second exothermic peak zone, as calculated by Equation 2.

15. The adhesive composition as claimed in claim 13, wherein the first exothermic peak zone has a peak height of about 0.01 W/g to about 0.5 W/g.

16. The adhesive composition as claimed in claim 13, wherein a second exothermic peak zone has a peak height of about 0.5 W/g to about 1.0 W/g.

17. The adhesive composition as claimed in claim 13, wherein:
the first exothermic peak appears at a temperature ranging from about 65° C. to about 185° C., and
the second exothermic peak appears at a temperature ranging from about 155° C. to about 350° C.

18. The adhesive composition as claimed in claim 13, wherein the adhesive composition includes:
about 16 to about 65 wt % of a thermoplastic resin,
about 10 to about 25 wt % of an epoxy resin,
about 0.5 to about 14 wt % of a phenolic curing agent,
about 1 to about 10 wt % of an amine curing agent,
about 0.1 to about 10 wt % of a phosphorus-containing catalyst,
about 0.14 to about 5 wt % of a silane coupling agent, and
about 10 to about 60 wt % of fillers, all wt % being based on a total solid content of the composition.

19. An adhesive film for semiconductors, the adhesive film being prepared using the adhesive composition as claimed in claim 1.

20. A semiconductor device comprising the adhesive film as claimed in claim 19.

21. An adhesive composition for semiconductors, the adhesive composition exhibiting two exothermic peaks at temperatures ranging from 65° C. to 350° C., wherein:
a first exothermic peak appears at a lower temperature than a second exothermic peak, and
the adhesive composition has a curing rate of about 70% to 100% in a first exothermic peak zone, as calculated by Equation 1:

Curing rate=[(Heating value upon 0 cycle−Heating value after 1 cycle)/Heating value upon 0 cycle]× 100 and wherein the adhesive composition includes:
a thermoplastic resin,
an epoxy resin,
curing agents, the curing agents include a phenolic curing agent and an amine curing agent, and
a curing catalyst, the curing catalyst includes a phosphorus-containing catalyst.

* * * * *